United States Patent
Like

(10) Patent No.: US 12,484,162 B2
(45) Date of Patent: Nov. 25, 2025

(54) ELECTRIC DISTRIBUTION BOX WITH CARRIER

(71) Applicant: Sumitomo Wiring Systems, Ltd., Yokkaichi (JP)

(72) Inventor: Nathan Like, Farmington Hills, MI (US)

(73) Assignee: Sumitomo Wiring Systems, Ltd., Yokkaichi (JP)

(*) Notice: Subject to any disclaimer, the term of this patent is extended or adjusted under 35 U.S.C. 154(b) by 163 days.

(21) Appl. No.: 18/394,538

(22) Filed: Dec. 22, 2023

(65) Prior Publication Data

US 2025/0212340 A1      Jun. 26, 2025

(51) Int. Cl.
*H05K 5/00*      (2025.01)
*B60R 16/03*      (2006.01)

(52) U.S. Cl.
CPC .............. *H05K 5/006* (2013.01); *B60R 16/03* (2013.01)

(58) Field of Classification Search
CPC .................................... H05K 5/06; B60R 16/03
USPC .................................. 361/728, 752, 796, 800
See application file for complete search history.

(56) References Cited

U.S. PATENT DOCUMENTS

| 4,986,767 | A | * | 1/1991 | Kozel | H01H 85/2035 |
| | | | | | 439/620.34 |
| 2004/0223304 | A1 | * | 11/2004 | Kobayashi | B60R 16/0239 |
| | | | | | 361/715 |
| 2007/0160195 | A1 | * | 7/2007 | Vo | H04Q 1/028 |
| | | | | | 379/413.04 |

FOREIGN PATENT DOCUMENTS

| CN | 204858284 U | 12/2015 |
| CN | 105914501 A | 8/2016 |
| CN | 107431343 A | 12/2017 |
| CN | 111579820 A | 8/2020 |
| CN | 218995472 U | 5/2023 |
| WO | 2022029126 A1 | 2/2022 |

* cited by examiner

*Primary Examiner* — Hung S. Bui
(74) *Attorney, Agent, or Firm* — Honigman, LLP; John Chau

(57) ABSTRACT

An electric distribution box assembly includes a biasing member formed of an electrically conductive material. The biasing member has a first end fixed to a first terminal and a second end spaced apart from a second terminal. An upper cover includes a resilient prong disposed above the second end of the biasing member, wherein a top cover is configured to: (1) press the resilient prong is against the second end of the biasing member to place the first terminal in electric contact with the second terminal; and (2) allow the resilient prong to be free of the second end of the biasing member when the top cover is removed wherein the second end of the biasing member is spaced apart from the other of the first terminal and the second terminal and disconnect power.

17 Claims, 10 Drawing Sheets

ELECTRIC DISTRIBUTION BOX WITH CARRIER

TECHNICAL FIELD

The present specification generally relates to an electric distribution box assembly and more particularly to an electric distribution box assembly having a having a carrier for determining an electric connection.

BACKGROUND

With reference to FIG. 1, a conventional electric distribution box assembly 500 is used in a platform, such as an automotive vehicle, to distribute power throughout the platform. The electric distribution box assembly 500 includes a housing 502 enclosed by an upper cover 504. The housing 502 holds electric components which are configured to distribute power from a power source, such as a battery to electric component throughout the platform.

The electric distribution box assembly 500 includes power terminals 506 for which wires are coupled to on one end and the battery on the other end. To perform maintenance on the electric distribution box assembly 500, power should be cut off. This may be done by physically unplugging wires from the terminals 506 from the housing or the battery. Detecting the voltage running through the electric distribution box assembly 500 helps determine if the electric distribution box assembly 500 is operating properly. Currently, the electric distribution box assembly 500 is disassembled to determine if power is cut off or detecting the voltage running through the electric distribution box assembly 500. In particular, the upper cover 502 is removed and a voltmeter is used to probe the electric contacts within the housing 504. A depiction of the electric distribution box assembly 500 showing the upper cover 502 removed is provided in FIG. 2. In doing so, the operator must be careful not to generate a short circuit by electrically connecting two leads. For instance, in FIG. 2, touching both the terminals 508 with a probe may generate a short circuit.

Accordingly, it remains desirable to have an electric distribution box assembly configured to determine/test power by simply removing the upper cover yet keep the electric components covered.

SUMMARY

In one aspect, an electric distribution box assembly is provided. The electric distribution box assembly is configured to distribute power from a battery to a plurality of electric devices. The electric distribution box assembly includes a first case; a fuse assembly, a top cover, a carrier and a printed circuit board. The fuse assembly is disposed within the first case. The fuse assembly includes a first bus bar. The top cover is mounted onto the first case and is configured to cover the fuse assembly. The top cover includes a probe opening. The carrier is disposed on the fuse assembly. The carrier includes a biasing mechanism. The printed circuit board is slidably disposed within the carrier. The printed circuit board includes an upper terminal and a lower terminal disposed on opposite ends of the printed circuit board. The biasing mechanism is configured to suspend the lower terminal above the first bus bar. The upper terminal is disposed beneath the probe opening, wherein the biasing mechanism is configured to translate a push of a probe onto the upper terminal to engage the lower terminal with the first bus bar so as to detect an electric connection.

In one aspect, the carrier may include a pair of slots spaced apart from each other and configured to hold opposite sides of the printed circuit board.

In one aspect, the carrier may include a pair of side walls and the biasing mechanism is an arm interposed between and spaced apart from the pair of side walls. In such an aspect, the carrier may further include a back wall extending along a plane defining a height of the electric distribution box and the arm is disposed on a distal end of the back wall, the arm is angled relative to the back wall. In such an aspect, at least one of the pair of side walls may be fixed to the fuse assembly.

In one aspect, the electric distribution box assembly further include a second bus bar and the probe opening is a pair of probe openings. In such an aspect, the first bus bar may be connected to a positive terminal of a power source and the second bus bar may be connected to a negative terminal of the power source.

In one aspect, the top cover may include a guide for receiving the probe. In such an aspect, the guide may include a cylindrical wall and a stop wall disposed at a distal end of the cylindrical wall. The cylindrical wall is recessed relative an upper wall and the probe opening disposed on the stop wall.

In one aspect, the electric distribution box assembly further include an upper cover configured to close the first case.

A carrier for use in an electric distribution box is also provided. The electric distribution box includes a first case, a fuse assembly and a top cover. The fuse assembly is disposed within the first case. The fuse assembly includes a first bus bar. The top cover is mounted onto the first case and is configured to cover the fuse assembly. The top cover includes a probe opening. The carrier includes a carrier body, a biasing mechanism and a printed circuit board. The carrier body is fixed to the fuse assembly. The biasing mechanism is disposed on the carrier body. The printed circuit board is slidably disposed within the carrier. The printed circuit board includes an upper terminal and a lower terminal disposed on opposite ends of the printed circuit board, the biasing mechanism configured to suspend the lower terminal above the first bus bar, the upper terminal disposed beneath the probe opening, wherein the biasing mechanism is configured to translate a push of a probe onto the upper terminal to engage the lower terminal with the first bus bar so as to detect an electric connection.

In one aspect, the carrier body may include a pair of slots spaced apart from each other and configured to hold opposite sides of the printed circuit board.

In one aspect, the carrier body may include a pair of side walls and the biasing mechanism is an arm interposed between and spaced apart from the pair of side walls. In such an aspect, the carrier body may further include a back wall extending along a plane defining a height of the electric distribution box and the arm is disposed on a distal end of the back wall, wherein the arm is angled relative to the back wall. In such an aspect, at least one of the pair of side walls may be fixed to the fuse assembly.

In one aspect, the upper terminal is electrically connected to the lower terminal. In such an aspect, the printed circuit board further includes a plurality of fuses.

Accordingly, the electric distribution box disclosed herein allows power to be determined by simply inserting a probe into the top cover wherein the electric components remain covered and the risk of generating a short circuit is minimized.

BRIEF DESCRIPTION OF THE DRAWINGS

The embodiments set forth in the drawings are illustrative and exemplary in nature and not intended to limit the subject matter defined by the claims. The following description of the illustrative embodiments can be understood when read in conjunction with the following drawings, where like structure is indicated with like reference numerals and in which:

DETAILED DESCRIPTION OF PREFERRED EMBODIMENTS

Figure 1:
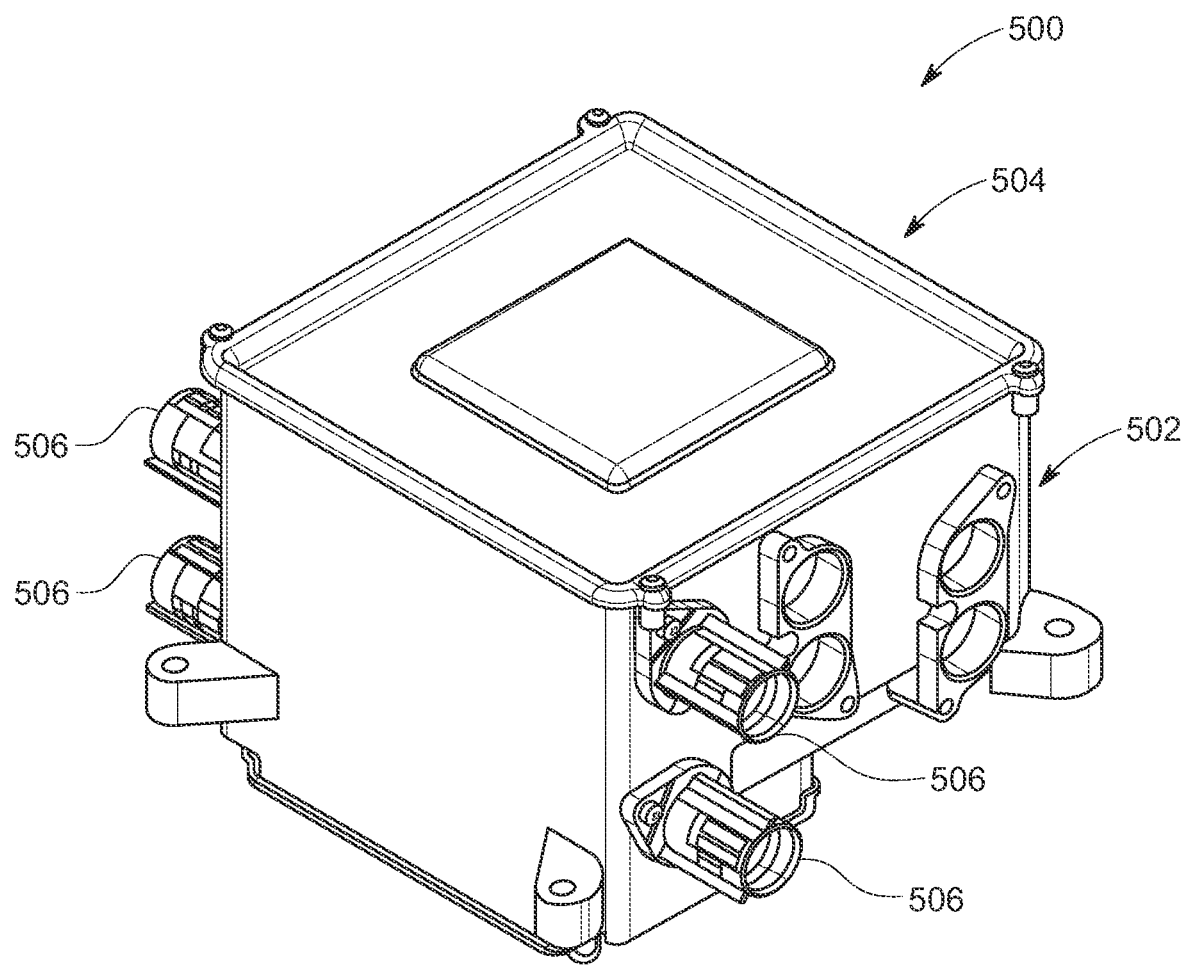
FIG. 1 is a depiction of a conventional electric distribution box.
Figure 2:
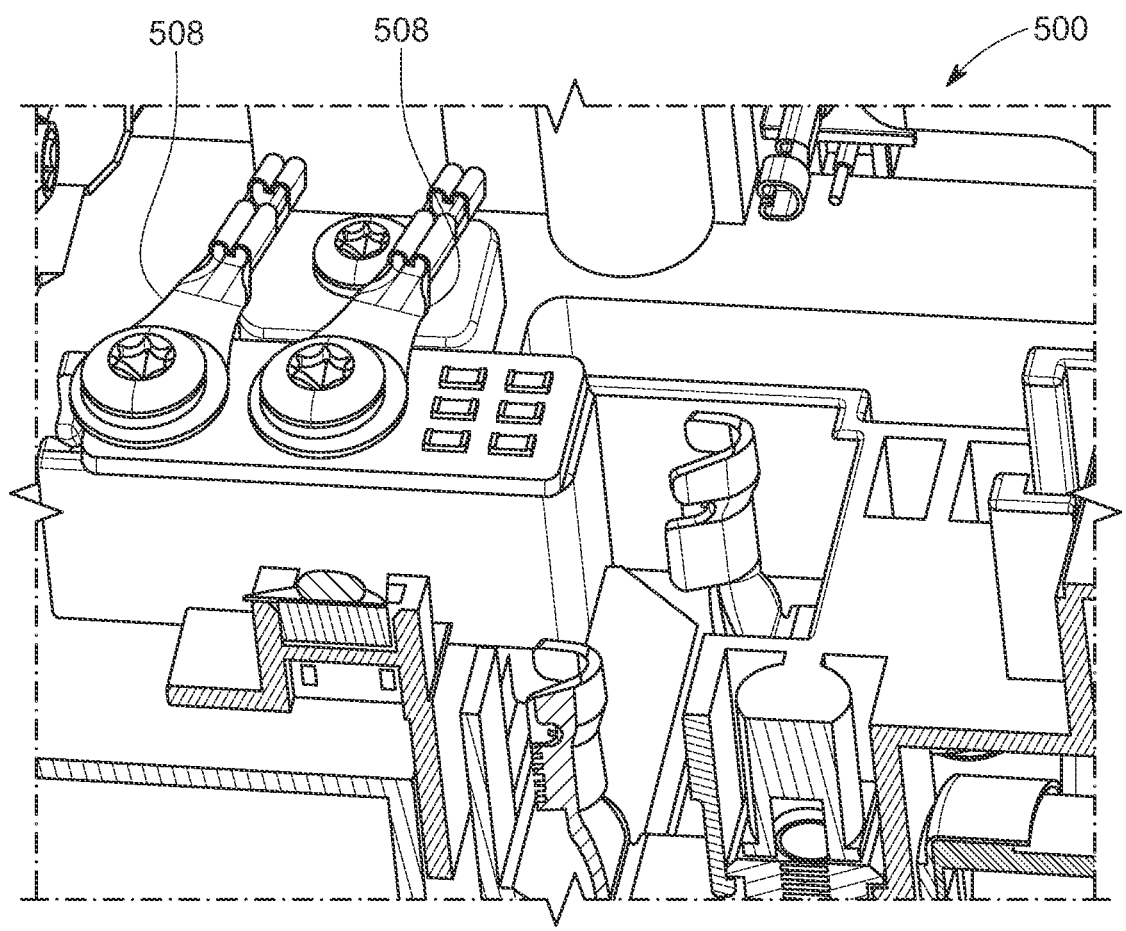
FIG. 2 is a depiction of the electric components within the electric distribution box shown in FIG. 1.

Example configurations will now be described more fully with reference to the accompanying drawings. Example configurations are provided so that this disclosure will be thorough, and will fully convey the scope of the disclosure to those of ordinary skill in the art. Specific details are set forth such as examples of specific components, devices, and methods, to provide a thorough understanding of configurations of the present disclosure. It will be apparent to those of ordinary skill in the art that specific details need not be employed, that example configurations may be embodied in many different forms, and that the specific details and the example configurations should not be construed to limit the scope of the disclosure.

The terminology used herein is for the purpose of describing particular exemplary configurations only and is not intended to be limiting. As used herein, the singular articles "a," "an," and "the" may be intended to include the plural forms as well, unless the context clearly indicates otherwise. The terms "comprises," "comprising," "including," and "having," are inclusive and therefore specify the presence of features, steps, operations, elements, and/or components, but do not preclude the presence or addition of one or more other features, steps, operations, elements, components, and/or groups thereof. The method steps, processes, and operations described herein are not to be construed as necessarily requiring their performance in the particular order discussed or illustrated, unless specifically identified as an order of performance. Additional or alternative steps may be employed.

When an element or layer is referred to as being "on," "engaged to," "connected to," "attached to," or "coupled to" another element or layer, it may be directly on, engaged, connected, attached, or coupled to the other element or layer, or intervening elements or layers may be present. In contrast, when an element is referred to as being "directly on," "directly engaged to," "directly connected to," "directly attached to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Referring generally to the figures, embodiments of the present disclosure include an electric distribution box assembly having a top cover that includes a probe opening. The top cover covers a fuse assembly for directing power. The fuse assembly includes a carrier having a biasing mechanism configured to suspend a lower terminal of a printed circuit board above the first bus bar and position an upper terminal of the printed circuit board beneath the probe opening, wherein the biasing mechanism is configured to translate a push of a probe onto the upper terminal to engage the lower terminal with the first bus bar so as to detect an electric connection. Accordingly, the electric distribution box disclosed herein allows power to be determined by simply inserting a probe into the top cover wherein the electric components remain covered and the risk of generating a short circuit is minimized.

Figure 3:
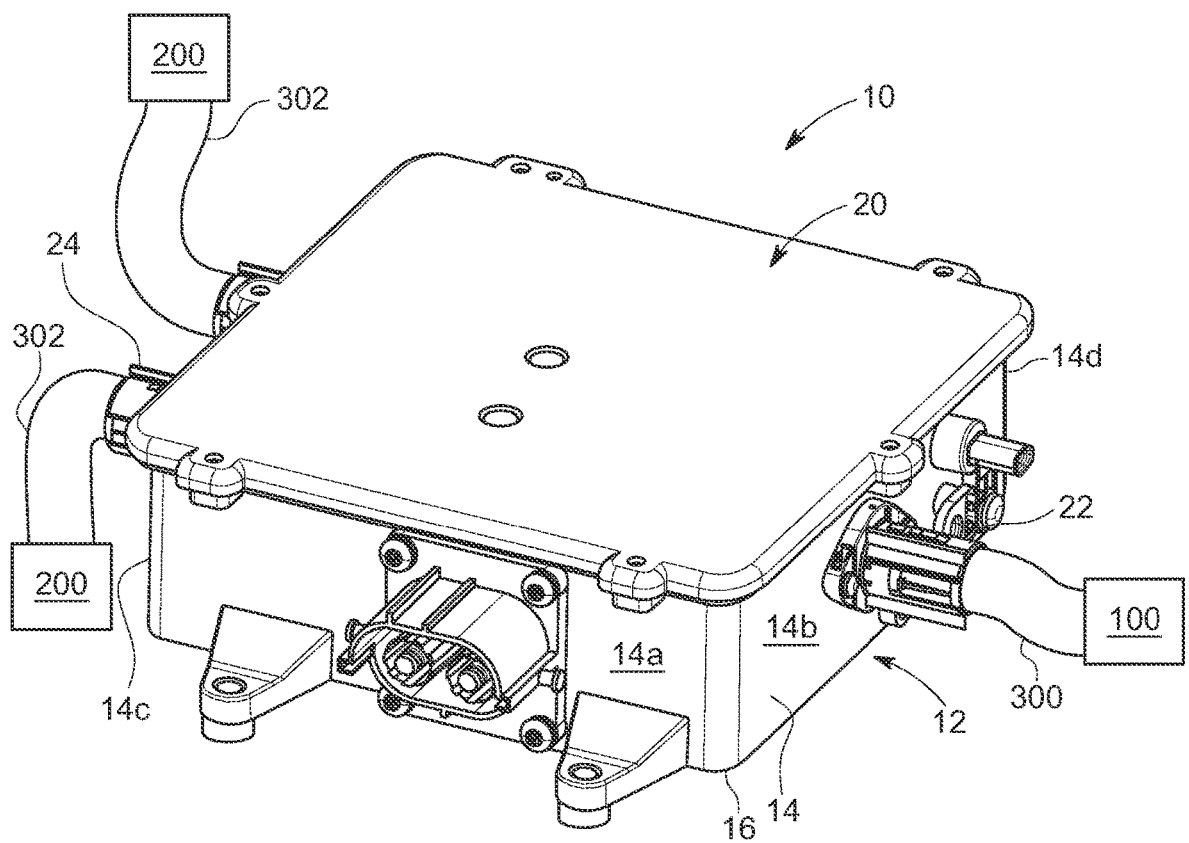
FIG. 3 is an exemplary depiction of an electric distribution box assembly according to one or more embodiments illustrated herein.
Figure 4:
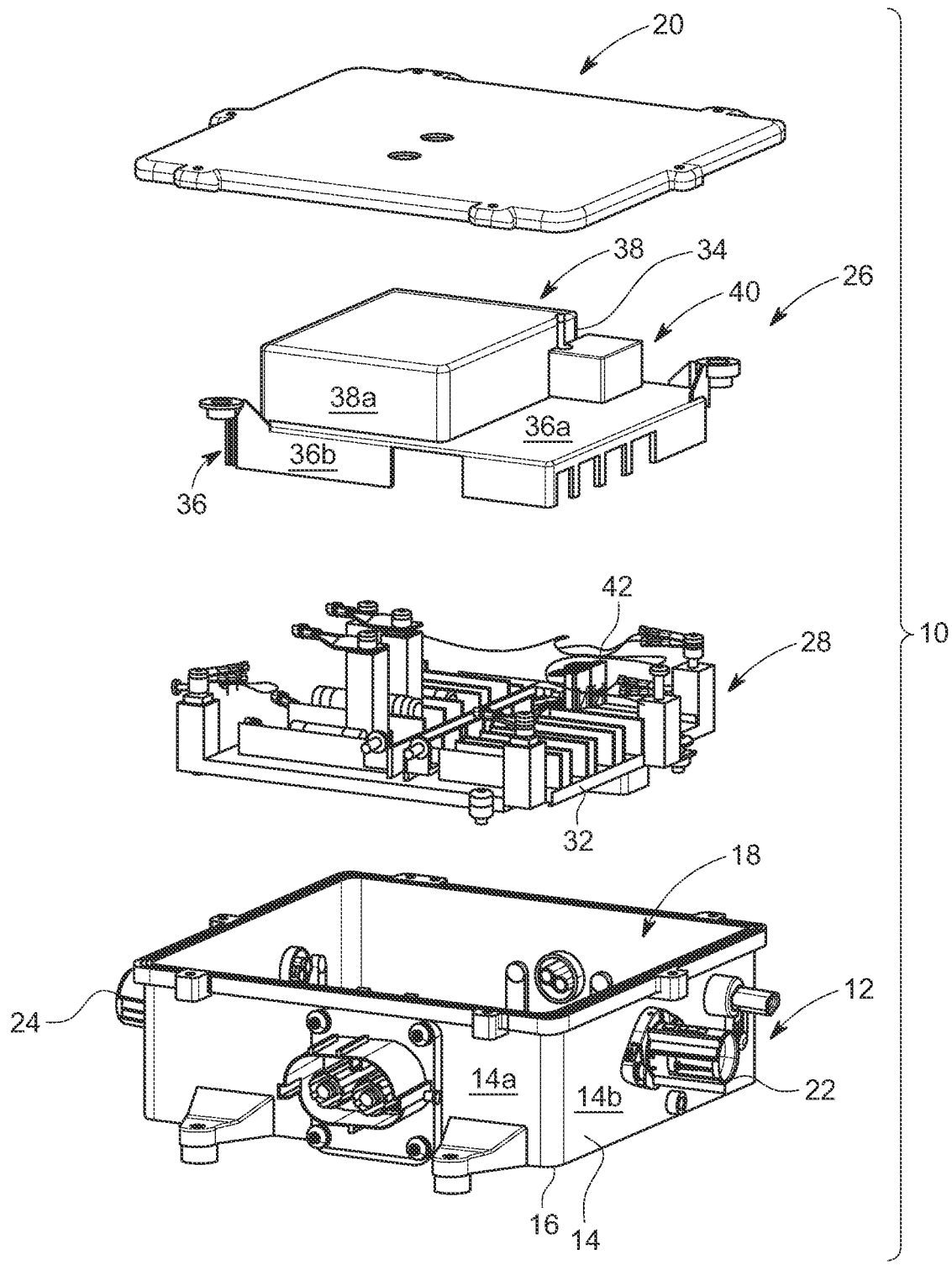
FIG. 4 is an exploded view of the electric distribution box assembly shown in FIG. 3.

With reference first to FIGS. 3 and 4, a perspective view of an illustrative embodiment of an electric distribution box assembly 10 is provided. The electric distribution box assembly 10 is configured to house a plurality of electric components. Such electric components illustratively include a relay switch, fuses and the like.

The electric components are configured to direct power from a power source such as a battery 100 to various electric devices 200 such as actuators, motors and devices. For illustrative purposes, the electric distribution box assembly 10 disclosed herein is described within the context of an automotive vehicle (not shown). However, it should be appreciated that the electric distribution box assembly 10 is described herein in the context of an automotive vehicle for illustrative purposes but may be used in other applications. Accordingly, a description of the electric distribution box assembly 10 within the context of an automotive vehicle is not limiting to the scope of the appended claims.

With reference again to FIG. 3, the electric distribution box assembly 10 includes a first case 12 having an outer wall 14 and a floor 16 bounding a storage space and having a generally cuboidal dimension so as to define container with an open top 18. The outer wall 14 may be defined as having a front portion 14*a*, a pair of side portions 14*a*, 14*b* and a back portion 14*d*. The outer wall 14 is a generally planar member which may be formed of a resilient and durable material suitable for injection molding, illustratively including polypropylene, Acrylonitrile butadiene styrene, polyoxymethylene, polycarbonate and the like.

The electric distribution box assembly 10 may further include an upper cover 20 configured to close the open top 18. The pair of side portions 14*a*, 14*b* may include a first power terminal 22 and a second power terminal 24 extending from an exterior surface thereof. The first power terminal 22 and the second power terminal 24 are configured to receive a first wire 300 and a second wire 302 respectively. The first wire 300 is attached to the power source 100, such as a battery, to provide power to the electric distribution box assembly 10 and the second wire 302 supplies power from the power source 100 to the electric devices 200 external to the electric distribution box assembly 10. The upper cover 20 and the bottom cover 22 may be attached to the first case 12 using conventional fastening means such as a bolt, a screw or a clips.

With reference now to FIG. 4, the electric distribution box assembly 10 further includes a top cover 26 and a fuse assembly 28, both of which are disposed within the first case 12. The fuse assembly 28 is configured to hold the electric components for distributing power from the battery to the electric devices 200. In particular, the fuse assembly 28 includes a bus bar 30 (see FIGS. 9-11) for routing power through the various electric components. The fuse assembly 28 includes a base portion 32 which is a generally planar member configured to be seated onto the floor 16 of the first case 12. The base portion 32 is configured to accommodate various structure for accommodating the electric components which includes towers and the like for packaging the electric components. The fuse assembly 28 may include conventional mounting members for fixing the fuse assembly 28 to the floor 16 of the first case.

The top cover 26 is mounted onto the fuse assembly 28 and is configured to cover the fuse assembly 28 and may include conventional mounting members for fixing the top cover 26 to the fuse assembly 28. The top cover 26 includes a probe opening 34 for receiving a probe 400. The first case 12, the top cover 26 and the fuse assembly 28 are a generally resilient members that are not electrically conductive and formed of a material suitable for injection molding, illustratively including polypropylene, Acrylonitrile butadiene styrene, polyoxymethylene, polycarbonate and the like.

Figure 5:
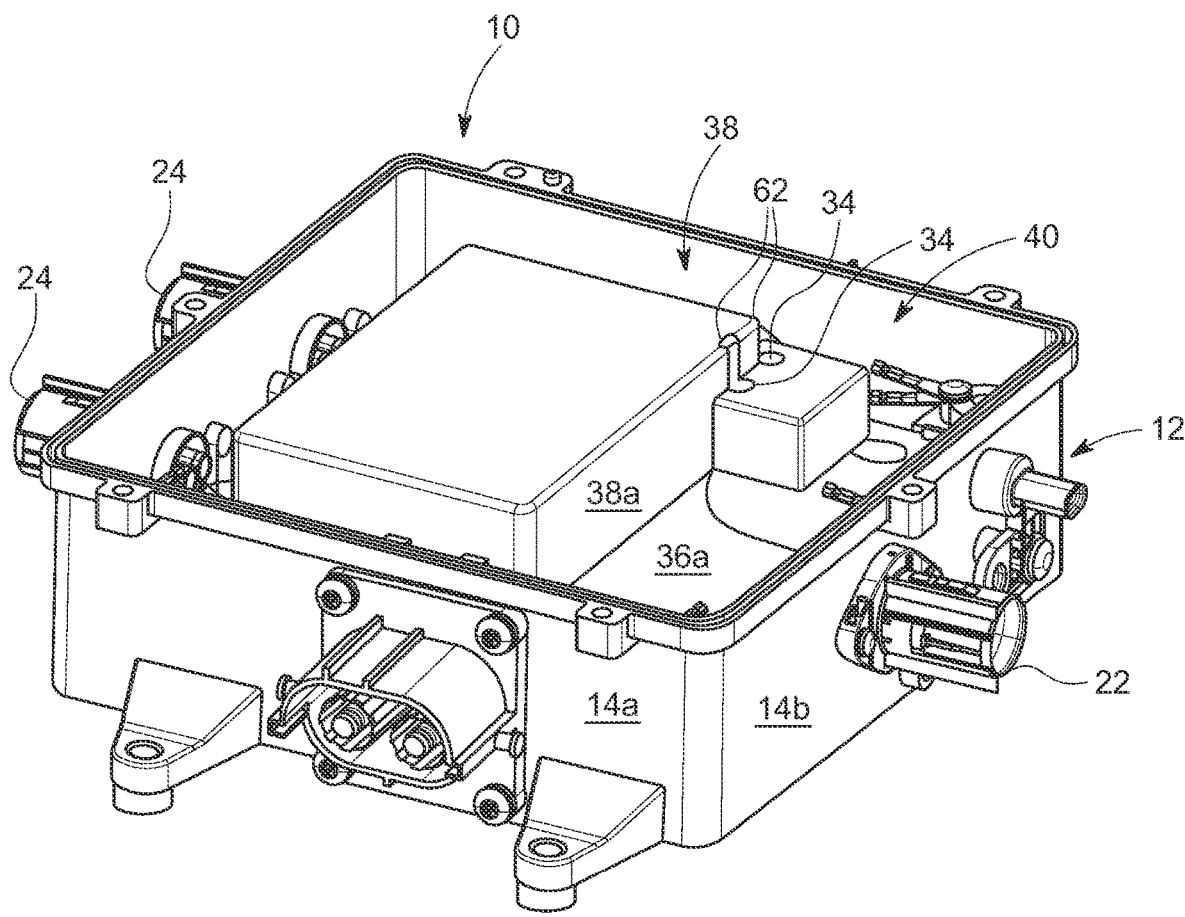
FIG. 5 is a perspective view of the first case shown in FIG. 4 with the upper cover removed.

With reference now to FIG. 5, a depiction of the electric distribution box assembly 10 with the upper cover 20 removed is provided. The top cover 26 is shown mounted onto the fuse assembly 28 so as to cover the electric components of the fuse assembly 28. The top cover 26 is configured to accommodate the fuse assembly 28 and is illustratively shown as having an upper wall 36 for covering the top and sides of the fuse assembly 28. The upper wall 36 includes a top portion 36a that is generally planar and a curtain 36b extending downwardly from the periphery of the top portion 36a. The top cover 26 may further include a first housing unit 38 and a second housing unit 40 disposed on the upper wall 36.

For illustrative purposes, the probe opening 34 is formed on the upper wall 36 at the bottom of the second housing unit 40. The first housing unit 38 covers a surface area larger than the second housing unit 40 and is taller than the second housing unit 40 as a result of the structure of the fuse assembly 28. The probe opening 34 is hidden by the second housing unit 40. The first housing unit 38 may include a peripheral wall 38a and the second housing unit 40 is shown disposed adjacent a corner of the first housing unit 38 so as to register the probe opening 34 with a carrier 42 as will be explained in greater detail below.

Figure 6:
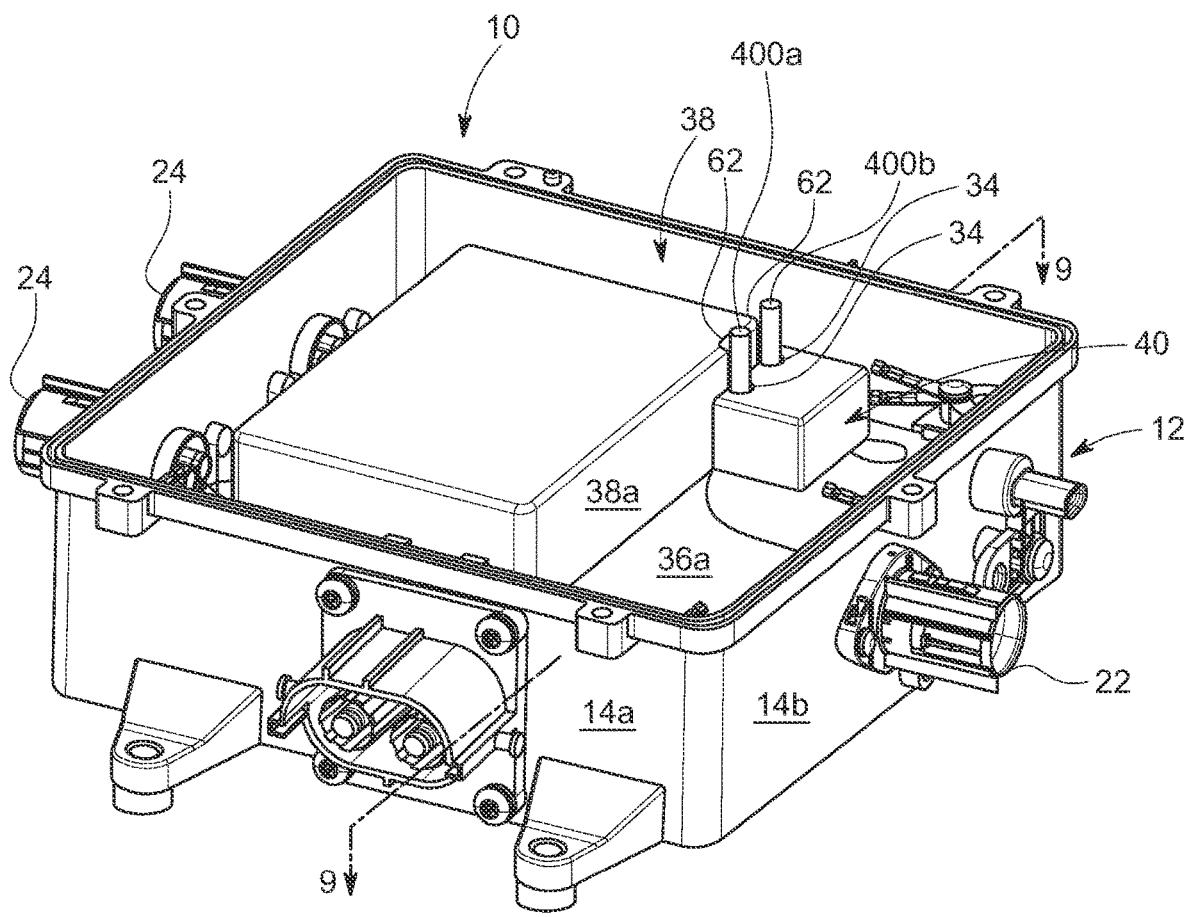
FIG. 6 is a view of FIG. 5 showing a probe inserted into the probe opening.

With reference now to FIG. 6, a pair of probes 400a, 400b (as used herein, 400 is used to reference the probe generally and 400a, 400b are used to reference a specific probe as discussed in greater detail below) are shown inserted into a pair of probe openings 34. Thus, it should be appreciated that the dimension of the top cover 26 is provided for illustrative purposes and may change without deviating from the scope of the appended claims.

Figure 7:
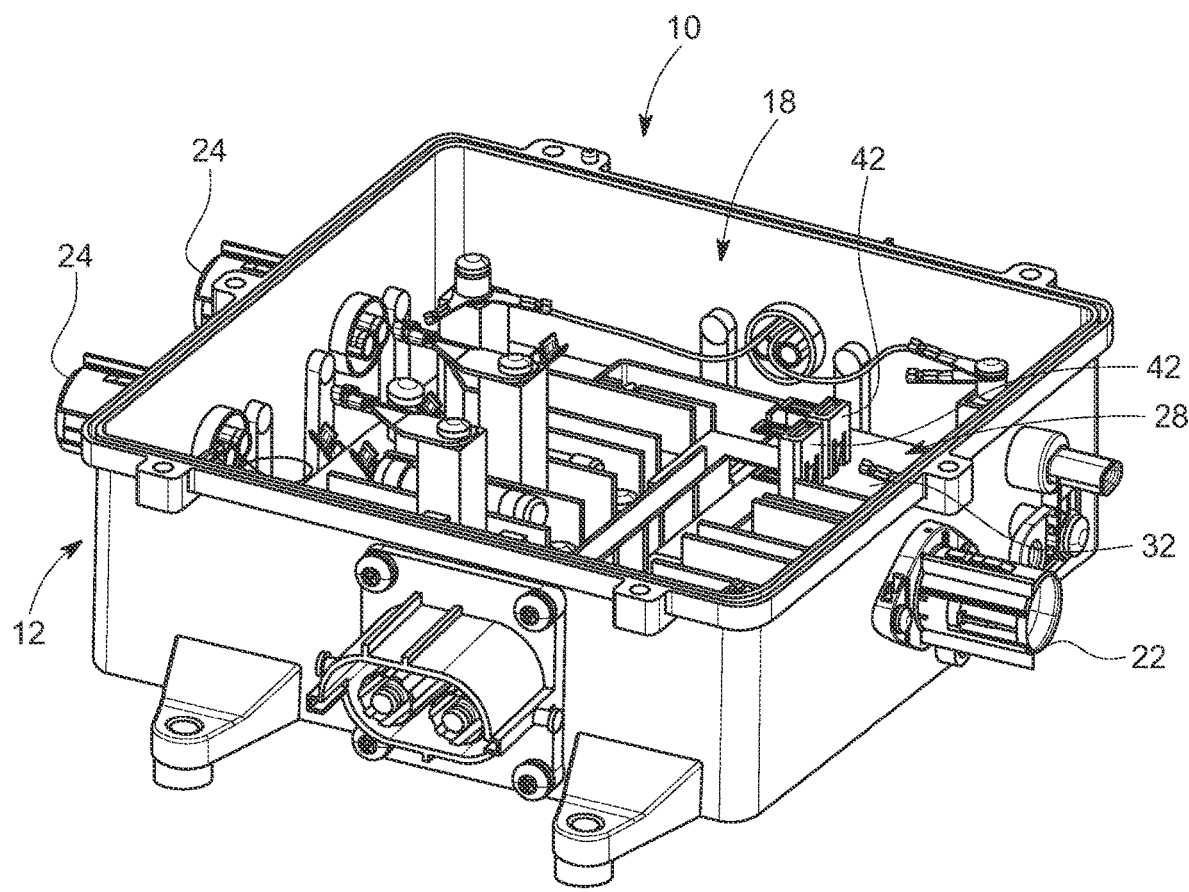
FIG. 7 is a view of FIG. 5 with the top cover removed.
Figure 8:
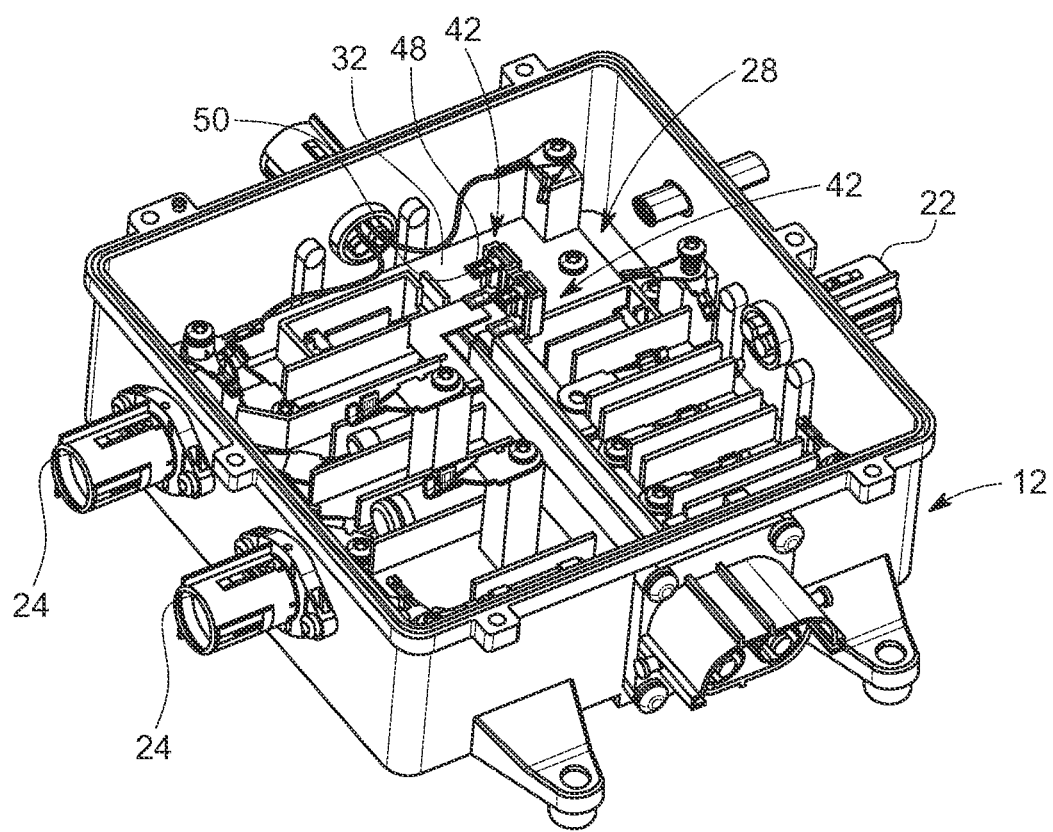
FIG. 8 is a perspective view of FIG. 7 showing the front side of the carrier.
Figure 11:
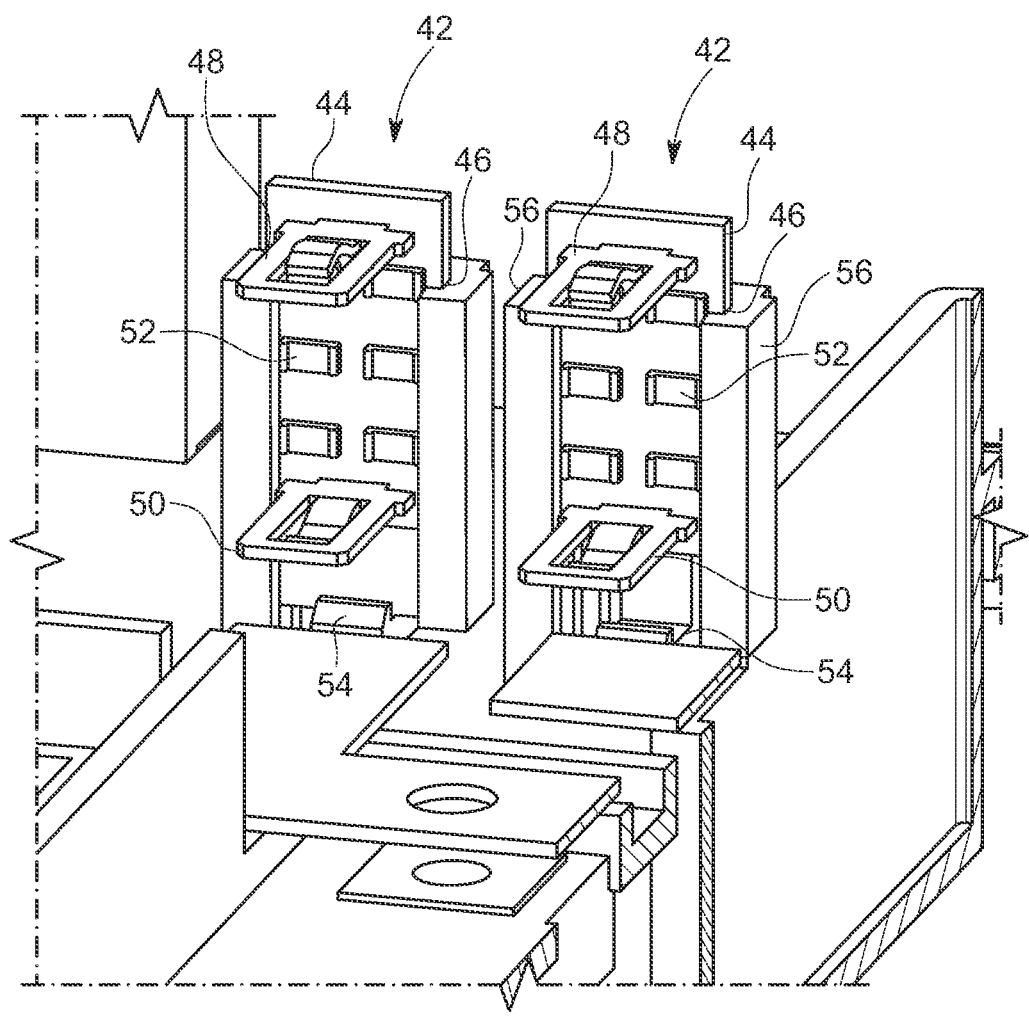
FIG. 11 is a close-up perspective view of the carrier shown in FIG. 8.

With reference now to FIGS. 7, 8 and 11, the electric distribution box assembly 10 further includes a carrier 42 and a printed circuit board 44. The carrier 42 is disposed on the fuse assembly 28 and is configured to hold the printed circuit board 44 in a slidingly manner. In one aspect, the carrier 42 may include a pair of slots 46 spaced apart from each other and configured to hold opposite sides of the printed circuit board 44. The slots 46 extend along an axis defining a height "H" of the carrier 42. In such an aspect, the slots 46 have a width "W" that is slightly larger than a thickness of the printed circuit board 44 so as to allow the printed circuit board 44 to slide within the carrier 42 in a direction corresponding to the height of the carrier 42. The carrier 42 is a generally resilient member and may be formed of a material suitable for injection molding, illustratively including polypropylene, Acrylonitrile butadiene styrene, polyoxymethylene, polycarbonate and the like.

The printed circuit board 44 is formed by conventional material including a core substrate formed of multiple layers of insulative and conductive material. The printed circuit board 44 includes an upper terminal 48 and a lower terminal 50 disposed on opposite ends of the printed circuit board 44 and in a fixed relationship with each other. The upper terminal 48 is electrically connected to the lower terminal 50 by conventional means such as an electric trace (not shown) printed on the printed circuit board 44 or embedded within the printed circuit board 44. The printed circuit board 44 may further include a plurality of fuses 52 interposed between the upper terminal 48 and the lower terminal 50 so as to regulate a voltage between the upper terminal 48 and lower terminal 50.

The carrier 42 includes a biasing mechanism 54 that is configured to hold the printed circuit board 44 in a non-contact position and configured to move the printed circuit board 44 into a contact position as described in greater detail below. In the non-contact position, the biasing mechanism 54 is configured to suspend the lower terminal 50 above the first bus bar 30a. The carrier 42 is disposed within the fuse assembly 28 so as to position the upper terminal 48 beneath the probe opening 34 and position the lower terminal 50 above the first bus bar 30a in the non-contact position. The biasing mechanism 54 is configured to translate a push of a probe 400 onto the upper terminal 48 to engage the lower terminal 50 with the first bus bar 30a and place the biasing mechanism 54 into the contact position so as to detect an electric connection.

The carrier 42 may include a pair of side walls 56 and a back wall 58. The carrier 42 is fixed to the fuse assembly 28. For instance, at least one of the pair of side walls 56 may be fixed to the fuse assembly 28 or formed integrally with the fuse assembly 28 in an injection molding process. The back wall 58 extends along a plane defining a height "H" of the electric distribution box. The side walls 56 are disposed on opposing ends of the back wall 58 and are generally orthogonal to the back wall 58. The slots 46 are disposed on a corresponding side wall 56. In one aspect, the biasing mechanism 54 is an arm 60 interposed between and spaced apart from the pair of side walls 56. In such an aspect, the arm 60 is disposed on a distal end of the back wall 58 and is angled relative to the back wall 58 so as to extend towards the interior of the fuse assembly 28.

For illustrative purposes, the electric distribution box assembly 10 is configured to detect a voltage by processing the voltage from the positive and negative terminals of the power source 100. In such as aspect, the electric distribution box assembly 10 further include a second bus bar 30b and the probe opening 34 is a pair of probe openings 34. In such an aspect, the first bus bar 30a may be connected to a positive terminal of a power source 100 and the second bus bar 30b may be connected to a negative terminal of the power source 100.

Similarly, the top cover 26 may include a pair of guides 62 for receiving a respective positive probe 400*a* and negative probe 400*b*. The guide 62 is configured to help guide the positive and negative probes 400*a*, 400*b* into a corresponding probe opening 34. For instance, the guides 62 may include a cylindrical wall and a stop wall disposed at a distal end of the cylindrical wall. The cylindrical wall is recessed relative an upper wall 36 and the probe opening 34 disposed on the stop wall.

Figure 9:
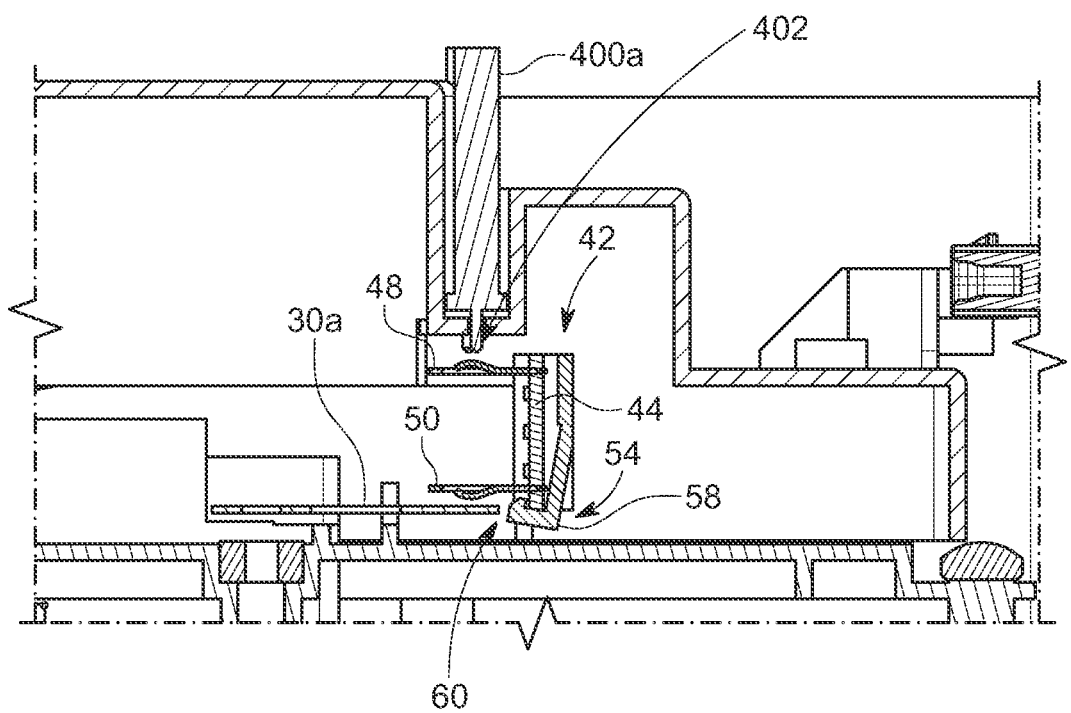
FIG. 9 is a cross-sectional view of FIG. 6 taken along line 9-9.

If maintenance is desired, the upper cover is simply removed exposing the top cover 26. The positive probe 400*a* and the negative probe 400*b* are inserted into a corresponding guide 62, as shown in FIG. 6. With reference now to FIG. 9, the probes 400*a*, 400*b* are shown as having a contact tip 402 formed of an electrically conductive material that is pressed through the probe opening 34. The contact tip 402 has a length configured to touch the upper terminal 48 when the probe 400 is pressed against the stop wall. FIG. 9 illustrates the printed circuit board 44 in the non-contact position wherein the lower terminal 50 is spaced apart and above the first bus bar 30*a*. Thus, power from the first bus bar 30*a* is not detected.

Figure 10:
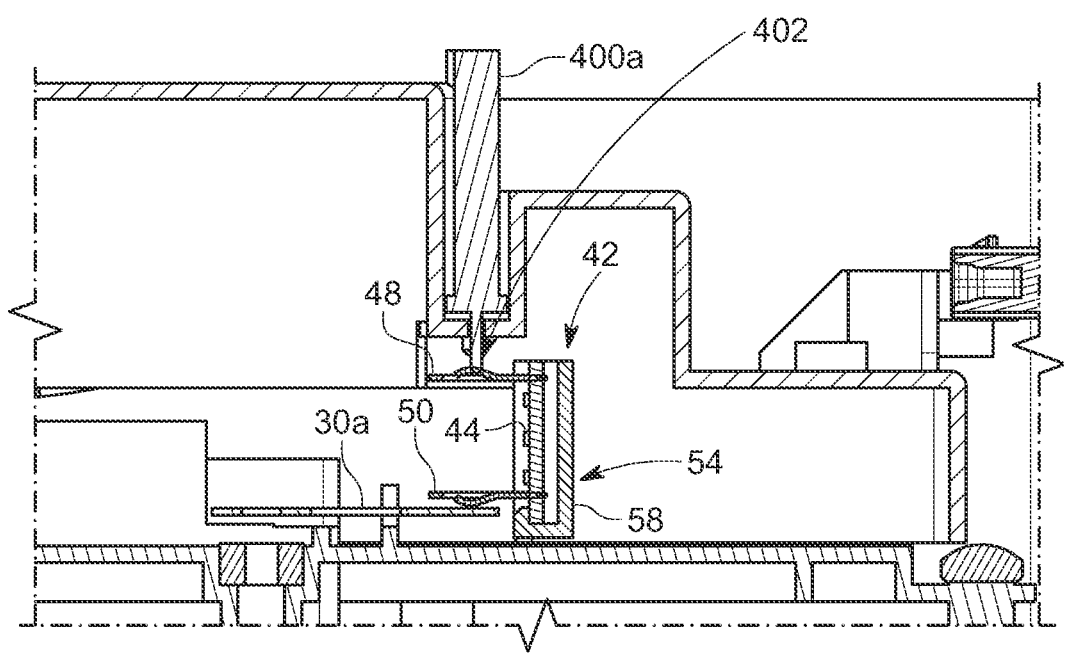
FIG. 10 is view of FIG. 9 showing probe pushing the lower terminal into contact with the bus bar.

With reference now to FIG. 10, the probe 400 is lowered relative to FIG. 9 and the contact tip presses the upper terminal 48 downwardly and the pressing the arm 60 inwardly, which lowers the lower terminal 50 into contact with the first bus bar 30*a* so as to make an electrical connection between the contact tip 402 and the first bus bar 30*a*. In instances where the probe 400 is configured to detect power through the electric distribution box assembly 10 by detecting power through the positive and negative terminals of the power source 100, the electric distribution box assembly 10 includes a pair of guides 62, a pair of probe openings 34, a pair of carriers 42 and a first bus bar 30*a* and a second bus bar 30*b*. In such an aspect, a pair of probes 400*a*, 400*b* are inserted into corresponding guides 62, each pressing downwardly against the upper terminal 48 of a corresponding carrier 42. When the probe 400 is removed, the arm 60 returns to its natural position and lifts the lower terminal 50 above the first bus bar 30*a* and the second bus bar 30*b*. It should be appreciated that the electric distribution box assembly 10 may be configured to detect power using a single probe 400, in which case, the printed circuit board 44 may be configured to process an electric current from a single bus bar 30, and the design of such a printed circuit board 44 is routine to those skilled in the art.

Accordingly, the electric distribution box disclosed herein allows power to be determined by simply inserting a probe 400 into the top cover 26 wherein the electric components remain covered and the risk of generating a short circuit is minimized.

While particular embodiments have been illustrated and described herein, it should be appreciated and understood that various other changes and modifications may be made without departing from the spirit and scope of the claim subject matter. Moreover, although various aspects of the claim subject matter have been described herein, such aspects need not be utilized in combination. It is therefore intended that the appended claims cover all such changes and modifications that are within the scope of the claim subject matter.

The invention claimed is:

1. An electric distribution box comprising:
   a first case;
   a fuse assembly disposed within the first case, the fuse assembly including a first bus bar;
   a top cover mounted onto the first case and configured to cover the fuse assembly, the top cover including a probe opening;
   a carrier disposed on the fuse assembly, the carrier including a biasing mechanism; and
   a printed circuit board slidably disposed within the carrier, the printed circuit board including an upper terminal and a lower terminal disposed on opposite ends of the printed circuit board, the biasing mechanism configured to suspend the lower terminal above the first bus bar, the upper terminal disposed beneath the probe opening, wherein the biasing mechanism is configured to translate a push of a probe onto the upper terminal to engage the lower terminal with the first bus bar so as to detect an electric connection.

2. The electric distribution box as set forth in claim 1, wherein the carrier includes a pair of slots spaced apart from each other and configured to hold opposite sides of the printed circuit board.

3. The electric distribution box as set forth in claim 1, wherein the carrier includes a pair of side walls and the biasing mechanism is an arm interposed between and spaced apart from the pair of side walls.

4. The electric distribution box as set forth in claim 3, wherein the carrier further includes a back wall extending along a plane defining a height of the electric distribution box and the arm is disposed on a distal end of the back wall, the arm is angled relative to the back wall.

5. The electric distribution box as set forth in claim 3, wherein at least one of the pair of side walls is fixed to the fuse assembly.

6. The electric distribution box as set forth in claim 1, further including a second bus bar and the probe opening is a pair of probe openings.

7. The electric distribution box as set forth in claim 6, wherein the first bus bar is connected to a positive terminal of a power source and the second bus bar is connected to a negative terminal of the power source.

8. The electric distribution box as set forth in claim 1, wherein the top cover includes a guide for receiving the probe.

9. The electric distribution box as set forth in claim 8, wherein the guide includes a cylindrical wall and a stop wall disposed at a distal end of the cylindrical wall, the cylindrical wall recessed relative an upper wall, the probe opening disposed on the stop wall.

10. The electric distribution box as set forth in claim 1, further including an upper cover configured to close the first case.

11. A carrier for use in an electric distribution box, the electric distribution box including a first case, a fuse assembly disposed within the first case, the fuse assembly including a first bus bar, and a top cover mounted onto the first case and configured to cover the fuse assembly, the top cover including a probe opening, the carrier comprising:
    a carrier body fixed to the fuse assembly;
    a biasing mechanism disposed on the carrier body; and
    a printed circuit board slidably disposed within the carrier, the printed circuit board including an upper terminal and a lower terminal disposed on opposite ends of the printed circuit board, the biasing mechanism configured to suspend the lower terminal above the first bus bar, the upper terminal disposed beneath the probe opening, wherein the biasing mechanism is configured to translate a push of a probe onto the upper terminal to engage the lower terminal with the first bus bar so as to detect an electric connection.

12. The carrier as set forth in claim 11, wherein the carrier body includes a pair of slots spaced apart from each other and configured to hold opposite sides of the printed circuit board.

13. The carrier as set forth in claim 11, wherein the carrier body includes a pair of side walls and the biasing mechanism is an arm interposed between and spaced apart from the pair of side walls.

14. The carrier as set forth in claim 13, wherein the carrier body further includes a back wall extending along a plane defining a height of the electric distribution box and the arm is disposed on a distal end of the back wall, the arm is angled relative to the back wall.

15. The electric distribution box as set forth in claim 13, wherein at least one of the pair of side walls is fixed to the fuse assembly.

16. The electric distribution box as set forth in claim 11, wherein the upper terminal is electrically connected to the lower terminal.

17. The electric distribution box as set forth in claim 16, wherein printed circuit board further includes a plurality of fuses.

\* \* \* \* \*